(12) United States Patent  
Origasa et al.

(10) Patent No.: US 7,877,667 B2  
(45) Date of Patent: Jan. 25, 2011

(54) SEMICONDUCTOR MEMORY

(75) Inventors: Kenichi Origasa, Osaka (JP); Kiyoto Ohta, Osaka (JP)

(73) Assignee: Panasonic Corporation, Osaka (JP)

( * ) Notice: Subject to any disclaimer, the term of this patent is extended or adjusted under 35 U.S.C. 154(b) by 993 days.

(21) Appl. No.: 11/714,762

(22) Filed: Mar. 7, 2007

(65) Prior Publication Data

US 2007/0260964 A1    Nov. 8, 2007

(30) Foreign Application Priority Data

Mar. 31, 2006    (JP) .............................. 2006-096186

(51) Int. Cl.
*G06F 11/00* (2006.01)
*G06F 11/08* (2006.01)
*G11B 20/18* (2006.01)

(52) U.S. Cl. ...................................... 714/763; 714/769
(58) Field of Classification Search ................ 714/763, 714/769

See application file for complete search history.

(56) References Cited

U.S. PATENT DOCUMENTS

| 5,864,568 | A  | * | 1/1999 | Nemazie ...................... 714/769 |
| 6,047,397 | A  | * | 4/2000 | Mons .......................... 714/763 |
| 6,243,845 | B1 | * | 6/2001 | Tsukamizu et al. ......... 714/769 |
| 6,363,511 | B1 | * | 3/2002 | Massoudi .................... 714/755 |
| 6,907,559 | B2 | * | 6/2005 | Hall et al. .................... 714/769 |
| 7,761,770 | B2 | * | 7/2010 | Larsen et al. ................ 714/758 |

* cited by examiner

*Primary Examiner*—Stephen M Baker
(74) *Attorney, Agent, or Firm*—Steptoe & Johnson LLP

(57) ABSTRACT

In order to correct an error in input data to thereby obtain write data, in a memory core, an EXOR element performs arithmetic processing based on an output result of an output data latch for latching read data and a result of inputted array input data, and a selector selects a result of the arithmetic processing to prepare write data. Thus, data obtained after performance of the arithmetic processing can be generated in a semiconductor memory by an operation performed immediately after data read. In addition, it is unnecessary to transfer data to an external logic circuit. Therefore, the result of the arithmetic processing can be written to a memory cell block in a subsequent clock.

5 Claims, 14 Drawing Sheets

F I G. 1 2   PRIOR ART

SEMICONDUCTOR MEMORY

BACKGROUND OF THE INVENTION (1) Field of the Invention

The present invention relates to a semiconductor memory which is mounted on a semiconductor device formed on a semiconductor substrate and stores data obtained by arithmetic processing or the like.

(2) Description of the Related Art

With reference to the drawings, hereinafter, description will be given of a conventional semiconductor memory for storing data obtained by arithmetic processing or the like in a semiconductor device.

FIG. 12 is a block diagram showing a configuration of the semiconductor device on which the conventional semiconductor memory is mounted. As shown in FIG. 12, the semiconductor device 1 includes a functional block 2, the semiconductor memory (hereinafter, simply referred to as "memory") 3 having a function of storing data, an analog-to-digital (hereinafter, abbreviated as "A/D") converter 4, a logic circuit 5, and a pad 6.

Specifically, the semiconductor device 1 is configured by the functional block 2 and the memory 3. The functional block 2 is configured by the logic circuit 5 and the A/D converter 4. The logic circuit 5 is electrically connected to the A/D converter 4 and the memory 3. The pad 6 is connected to the A/D converter 4.

With reference to the drawings, next, description will be given of data correction sequences in the semiconductor device 1 configured as described above.

FIG. 13 shows data inversion sequences in the semiconductor device 1. FIG. 14 is a timing chart showing waveforms of signals received by the memory 3.

In a case where the logic circuit 5 recognizes a bit to be corrected in data stored in the memory 3, first, the logic circuit 5 transfers a read command to the memory 3 to acquire read data. Then, the logic circuit 5 prepares corrected appropriate data as write data based on the read data and information about an inverted bit. Next, the logic circuit 5 executes a write command based on the appropriate data to write the data to the memory 3. That is, conventionally, the data inversion sequences in the memory 3 include a read operation, a standby time and a write operation.

In a case where the aforementioned semiconductor device 1 is used for reading data from a storage medium such as an optical disc, and then storing the read data, occasionally, data different from intended data is stored in the memory 3 due to an influence of noise. In order to avoid an erroneous operation due to the aforementioned disadvantage, there is prepared a parity bit for error correction such as an ECC; thus, an inverted bit can be identified.

As described above, in the semiconductor device 1, the memory 3 (e.g., a DRAM) reads erroneous data therefrom in the read operation, and the logic circuit 5 inverts an erroneous bit to prepare appropriate data and writes back the appropriate data to the memory 3 in the write operation. Consequently, it takes much time to perform error correction on data.

Therefore, there arises a problem that data stored in the memory 3 cannot be subjected to error correction at a high speed.

SUMMARY OF THE INVENTION

The present invention is devised in order to solve the aforementioned conventional problems. An object of the present invention is to provide a semiconductor memory capable of correcting an error in data stored therein more promptly.

In order to accomplish this object, according to a first aspect of the present invention, a semiconductor memory is mounted on a semiconductor device for correcting an error in data to be inputted thereto/outputted therefrom and stores the data. The semiconductor memory includes: a plurality of memory cell arrays each storing the data; a read circuit reading the data from the memory cell array; a read data latch latching the read data from the read circuit; an input data latch latching input data received by the semiconductor device; a computing unit performing arithmetic processing on the input data of the input data latch and the read data of the read data latch; a selector selecting one of data obtained by the arithmetic processing of the computing unit and the input data from the input data latch in accordance with presence/absence of an error in the data; and a write buffer writing the data of the selector to the memory cell array. Herein, when the error in the data is to be corrected, the semiconductor memory corrects the error in the data based on the data from the computing unit.

With this configuration, it is possible to perform arithmetic processing for error correction on data read from the semiconductor memory at a high speed. Thus, it is possible to perform data processing such as error correction at a high speed.

According to a second aspect of the present invention, the semiconductor memory further includes a read control terminal, a write control terminal and a data output terminal. Herein, the data of the memory cell array is outputted to the data output terminal when the read control terminal is at a first potential and the write control terminal is at a second potential, the input data is written to the memory cell array when the read control terminal is at the second potential and the write control terminal is at the first potential, and the result of the arithmetic processing performed on the data of the memory cell array and the input data is written to the memory cell array when the read control terminal and the write control terminal are at the second potential.

With this configuration, it is possible to perform arithmetic processing for error correction at a high-speed without an increase of connection terminals in number.

According to a third aspect of the present invention, the semiconductor memory operates in synchronization with external clocks, and when the read control terminal and the write control terminal are at the second potential, the data stored in the memory cell array is read during a period of a first clock of the external clocks and the result of the arithmetic processing performed by the computing unit on the data stored in the memory cell array and the input data is written to the memory cell array during a period of a second clock subsequent to the first clock.

With this configuration, it is possible to facilitate timing control in synchronization with a clock, and to perform arithmetic processing for error correction with a clock timing unitized at maximum.

According to a fourth aspect of the present invention, the computing unit performs an EXOR operation.

With this configuration, it is possible to invert a bit to be subjected to error determination by means of an ECC circuit or the like.

According to a fifth aspect of the present invention, the semiconductor memory further includes a read control terminal, a write control terminal, an inversion write control terminal and a data output terminal. Herein, the data of the memory cell array is outputted to the data output terminal when the read control terminal is at a first potential and the write control terminal and the inversion write control terminal are at a second potential, the input data is written to the memory cell array when the read control terminal and the inversion write control terminal are at the second potential and the write control terminal is at the first potential, and the result of the arithmetic processing performed on the data of the memory cell array and the input data is written to the memory cell array when the read control terminal and the write control terminal are at the second potential and the inversion write control terminal is at the first potential.

With this configuration, it is possible to perform arithmetic processing on data latched by the data latch in the semiconductor memory at a high speed. Thus, it is possible to perform data processing such as error correction more promptly.

According to the present invention, as described above, in order to correct an error in read data, a semiconductor memory can perform arithmetic processing for error correction on the read data in sequence to thereby generate appropriate data immediately after completion of the read operation. In addition, it is unnecessary to transfer such data to an external logic circuit. Therefore, the semiconductor memory can write thereto a result of the arithmetic processing in a subsequent clock.

Accordingly, the semiconductor memory can perform arithmetic processing on read data at a high speed to thereby invert such data. As a result, it is possible to write desired data to the semiconductor memory in a short period of time, and to perform data processing such as error correction more promptly.

BRIEF DESCRIPTION OF THE INVENTION

DESCRIPTION OF THE PREFERRED EMBODIMENTS

Hereinafter, specific description will be given of preferred embodiments of the present invention with reference to the drawings.

First Embodiment

First, description will be given of a semiconductor memory according to a first embodiment of the present invention.

Figure 1:
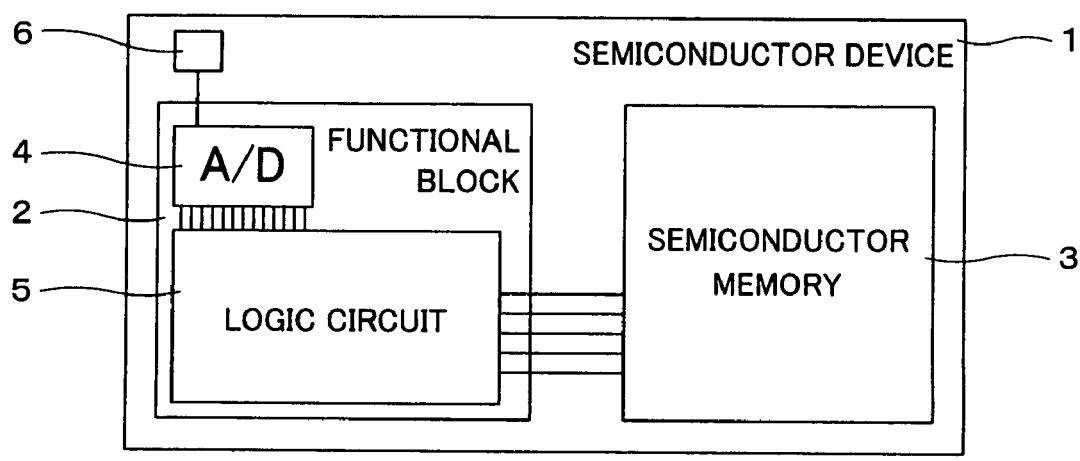
FIG. 1 is a block diagram showing a configuration of a semiconductor device on which a semiconductor memory according to a first embodiment of the present invention is mounted.

FIG. 1 is a block diagram showing a configuration of a semiconductor device on which the semiconductor memory according to the first embodiment is mounted. As shown in FIG. 1, the semiconductor device 1 includes a functional block 2, the semiconductor memory (hereinafter, simply referred to as "memory") 3 according to the present invention, an analog-to-digital (hereinafter, abbreviated as "A/D") converter 4, a logic circuit 5, and a pad 6.

Specifically, the semiconductor device 1 is configured by the functional block 2 and the memory 3. The functional block 2 is configured by the logic circuit 5 and the A/D converter 4. The logic circuit 5 is electrically connected to the A/D converter 4 and the memory 3. The pad 6 is connected to the A/D converter 4.

Figure 2:
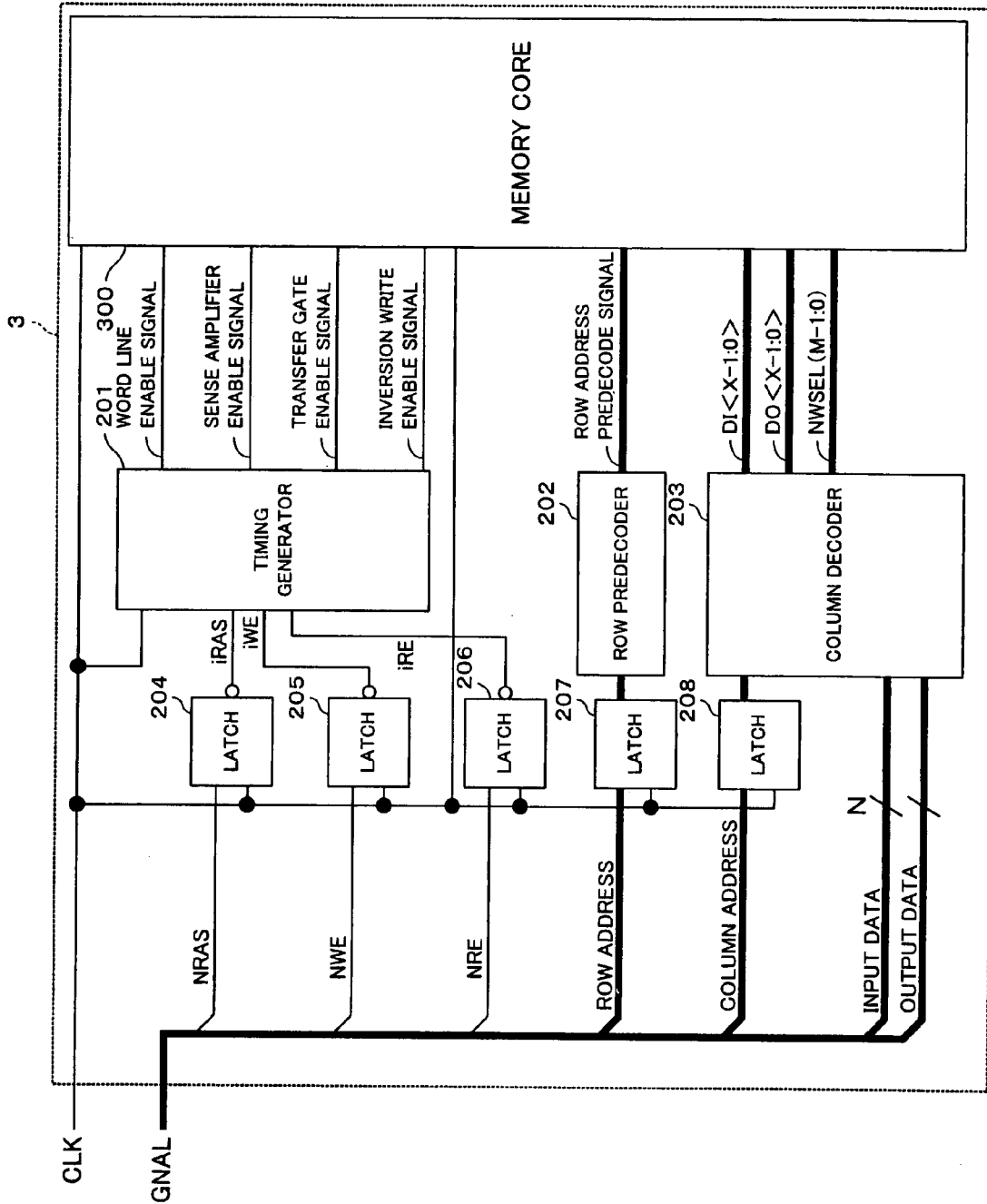
FIG. 2 is a circuit block diagram showing a configuration of the semiconductor memory according to the first embodiment.

FIG. 2 is a circuit block diagram showing the memory 3. As shown in FIG. 2, the memory 3 includes a timing generator 201, a row predecoder 202, a column decoder 203, output inversion latch circuits 204, 205 and 206, latch circuits 207 and 208, and a memory core 300. Herein, the memory 3 receives a row address strobe signal NRAS, a write operation control signal NWE and a read operation control signal NRE, and generates an internal row address strobe signal iRAS, an internal write operation control signal iWE and an internal read operation control signal iRE. A DRAM I/F signal is a group of control signals.

Specifically, the DRAM I/F signal includes a row address strobe signal NRAS, a write operation control signal NWE, a read operation control signal NRE, row addresses configured by "R" pieces of terminals required for controlling a memory capacity to be incorporated, column addresses configured by "C" pieces of terminals required for controlling a memory capacity to be incorporated, input data configured by "N" pieces of terminals, and output data configured by "N" pieces of terminals.

The output inversion latch circuits 204, 205 and 206 receive a row address strobe signal NRAS, a write operation control signal NWE and a read operation control signal NRE to generate an internal row address strobe signal iRAS, an internal write operation control signal iWE and an internal read operation control signal iRE, respectively. Each of the output inversion latch circuits 204 to 206 is controlled by a clock signal CLK.

Herein, there are provided "R" pieces of latch circuits 207 and "C" pieces of latch circuits 208. Each latch circuit 207 has an input end for receiving a row address, and an output end connected to an input end of the row predecoder 202. Each latch circuit 208 has an input end for receiving a column address, and an output end connected to an input end of the column decoder 203. Each of the latch circuits 207 and 208 is controlled by a clock signal CLK.

The timing generator 201 receives a clock signal CLK, an internal row address strobe signal iRAS, an internal write operation control signal iWE and an internal read operation control signal iRE to generate a word line enable signal, a sense amplifier enable signal, a transfer gate enable signal and an inversion write enable signal.

The row predecoder 202 receives "R" pieces of row addresses from the latch circuit 207 to generate row address predecode signals. The column decoder 203 receives column addresses from the latch circuit 208, "N" pieces of input data from a DRAM I/F, and "X" pieces of array output data DO from the memory core 300. Further, the column decoder 203 outputs "N" pieces of output data to the DRAM I/F, and outputs "X" pieces of array input data DI and "M" pieces of write buffer selection signals NWSEL to the memory core 300.

In this description, the symbols "X", "M" and "N" satisfy a relation: "X"="M"*"N". The memory 3 has a function of selectively sorting "N"-bit input/output data into "X"-bit array input data DI and "X"-bit array output data DO in accordance with a column address to be inputted. The memory 3 also has a function of selectively activating one of "M" pieces of write buffer selection signals NWSEL in accordance with the column address.

Figure 3:
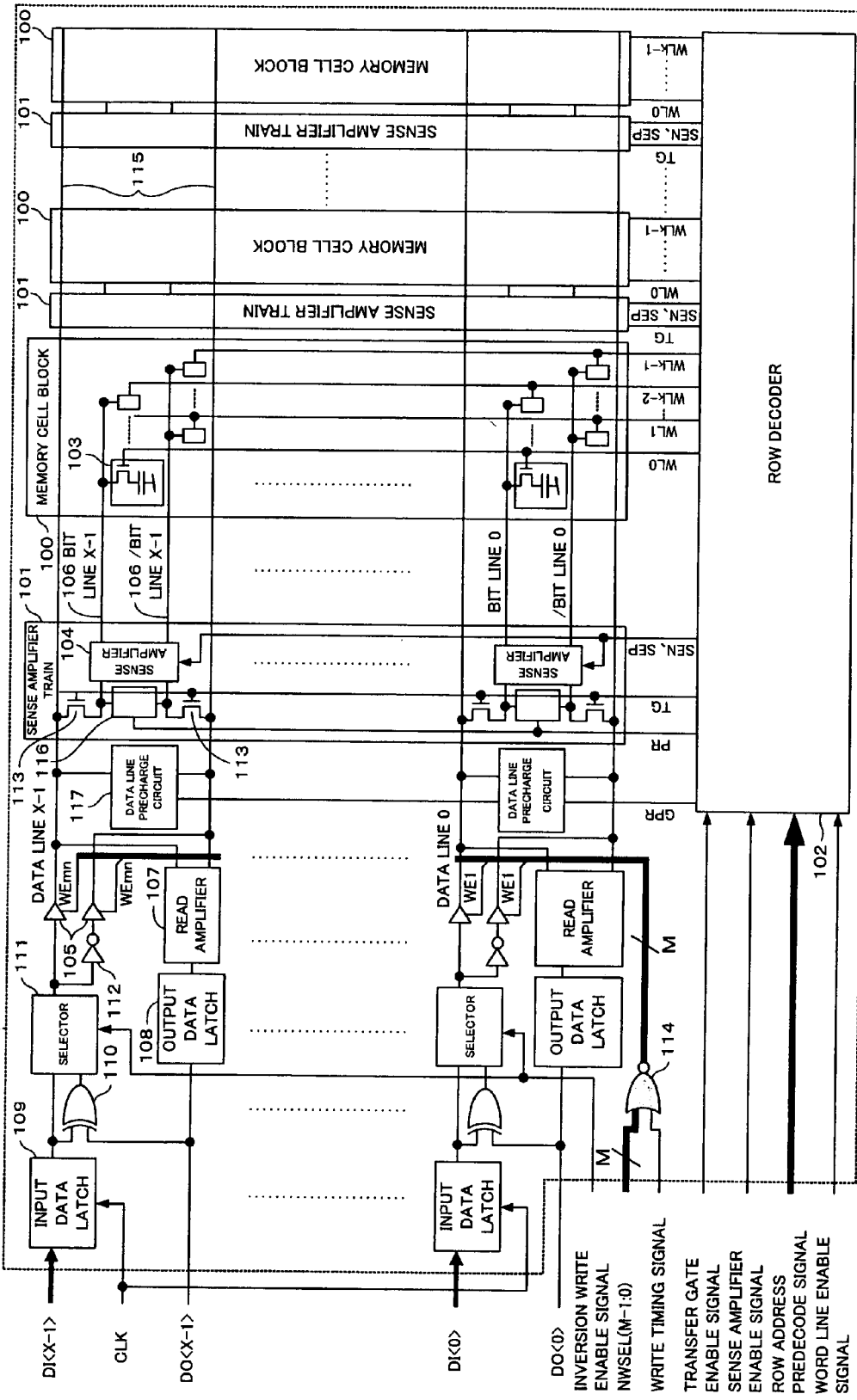
FIG. 3 is a circuit diagram showing a configuration of a memory core in the semiconductor memory according to the first embodiment.

FIG. 3 is a circuit diagram showing the memory core 300. As shown in FIG. 3, the memory core 300 includes a memory cell block 100, a sense amplifier train 101, a row decoder 102, a memory cell 103, a sense amplifier 104, a write buffer 105, a pair of bit lines 106, a read amplifier 107, an output data latch 108 serving as a read data latch, an input data latch 109, an EXOR element 110 performing an EXOR operation, a selector 111, an inverter 112, a transfer gate 113, an NOR element 114, a pair of data lines 115, a bit line precharge circuit 116, a data line precharge circuit 117, and a word line WLn. Herein, the memory core 300 receives an N-channel sense amplifier activation signal SEN, a P-channel sense amplifier activation signal SEP, a transfer gate control signal TG, a write buffer selection signal NWSEL, a write buffer activation signal WE, array output data DO, array input data DI, a precharge signal PR, a data line precharge signal GPR, and a clock signal CLK.

In the memory core 300, specifically, a memory cell block 100 has a configuration equal to that of a memory cell array in a typical DRAM. Herein, memory cell blocks 100 and sense amplifier trains 101 are increased/decreased in number if necessary. Each memory cell block 100 includes a plurality of memory cells 103. The memory cells 103 are provided at intersections between pairs of bit lines 106 and word lines WLn (n=0, 1, 2, . . . ), respectively, to form a memory cell array. Herein, one sense amplifier 104 is provided for one pair of bit lines 106. Such sense amplifier 104 receives an N-channel sense amplifier activation signal SEN and a P-channel sense amplifier activation signal SEP in order to control an operation thereof.

The memory cell blocks 100 and the sense amplifier trains 101 are controlled by a row decoder 102. The row decoder 102 has a typical configuration, and receives a transfer gate enable signal, a sense amplifier enable signal, a row address predecode signal and a word line enable signal. The row decoder 102 outputs signals to control the memory cell blocks 100 to the memory cell blocks 100 through word lines WLn (n=0, 1, 2, 3, . . . , k=1, 2, 3, . . . ). The row decoder 102 outputs a transfer gate control signal TG, an N-channel sense amplifier activation signal SEN and a P-channel sense amplifier activation signal SEP to each sense amplifier train 101. A bit line precharge circuit 116 is connected to the pair of bit lines 106, and is controlled by a bit line precharge signal PR.

In the sense amplifier train 101, each sense amplifier 104 is connected to a pair of data lines 115 through transfer gates 113. The transfer gate 113 is configured by an N-channel transistor, and receives a transfer gate control signal TG. The pair of data lines 115 are connected to input ends of a read amplifier 107 and receive data from write buffers 105, respectively. The read amplifier 107 has an output end connected to an input end of an output data latch 108, and the output data latch 108 has an output end for outputting one of array output data DO.

The write buffers 105 are connected to the pair of data lines 115 in a complementary manner. One of the write buffers 105 has an input end connected to an output end of a selector 111, and the other write buffer 105 has an input end connected to the output end of the selector 111 through an inverter 112 so as to invert data outputted from the selector 111. The write buffers 105 are controlled by one of write buffer activation signals WE. Herein, there are prepared "X" pairs of data lines 115 and "M" pieces of write buffer activation signals WE.

The "M" pieces of write buffer activation signals WE are outputted from "M" pieces of NOR elements 114 receiving "M" pieces of write buffer selection signals NWSEL each serving as a selection signal and a write timing signal serving as a timing signal used upon such selection. The selector 111 has an input end connected to an output end of an input data latch 109, and an input end connected to an output end of an EXOR element 110. The selector 111 receives an inversion write enable signal as a selection signal. The EXOR element 110 has an input end connected to the output end of the input data latch 109, and an input end connected to the output end of the output data latch 108. The input data latch 109 has an input end for receiving array input data DI, and an input end for receiving a clock signal CLK.

The pair of data lines 115 are also connected to a data line precharge circuit 117 controlled by a data line precharge signal GPR.

Figure 4:
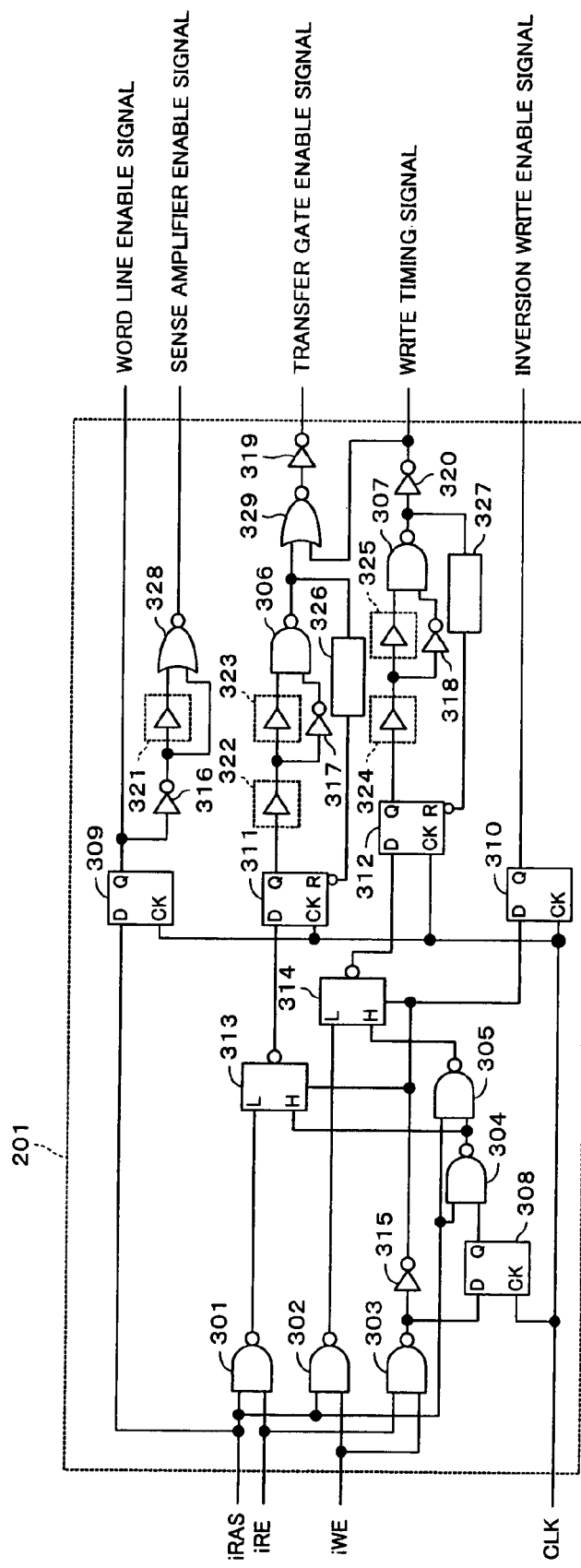
FIG. 4 is a circuit diagram showing a configuration of a timing generator in the semiconductor memory according to the first embodiment.

FIG. 4 is a circuit diagram showing the timing generator 201. As shown in FIG. 4, the timing generator 201 includes NAND elements 301, 302, 303, 304, 305, 306 and 307, D flip-flops 308, 309 and 310, D flip-flops with reset 311 and 312, output inversion selectors 313 and 314, inverters 315, 316, 317, 318, 319 and 320, delay elements 321, 322, 323, 324 and 325, one-shot pulse generation circuits 326 and 327, and NOR circuits 328 and 329.

The NAND element 301 has an input end for receiving an internal row address strobe signal iRAS, an input end for receiving an internal read operation control signal iRE, and an output end connected to an input end of the output inversion selector 313. The NAND element 302 has an input end for receiving an internal row address strobe signal iRAS, an input end for receiving an internal write operation control signal iWE, and an output end connected to an input end of the output inversion selector 314. The NAND element 303 has an input end for receiving an internal read operation control signal iRE, an input end for receiving an internal write operation control signal iWE, and an output end connected to an input end of the inverter 315 and an input end D of the D flip-flop 308.

The inverter 315 has an output end connected to a control end of the output inversion selector 313 and a control end of the output inversion selector 314. The output inversion selector 313 also has an input end connected to an output end of the NAND element 304. If data outputted from the inverter 315 is at "L" level, the output inversion selector 313 generates an inversion signal for data outputted from the NAND element 301. On the other hand, if such data is at "H" level, the output inversion selector 313 generates an inversion signal for data outputted from the NAND element 304. Likewise, the output inversion selector 314 also has an input end connected to an output end of the NAND element 305. If data outputted from the inverter 315 is at "L" level, the output inversion selector 314 generates an inversion signal for data outputted from the NAND element 302. On the other hand, if such data is at "H" level, the output inversion selector 314 generates an inversion signal for data outputted from the NAND element 305.

The D flip-flop 308 has an input end CK for receiving a clock signal CLK, and an output end Q connected to an input end of the NAND element 304. The NAND element 304 also has an input end for receiving an internal row address strobe signal iRAS. The NAND element 305 has an input end connected to the output end of the NAND element 304, and an input end for receiving an internal row address strobe signal iRAS.

The D flip-flop 309 has an input end D for receiving an internal row address strobe signal iRAS, an input end CK for receiving a clock signal CLK, and an output end Q for outputting a word line enable signal. The D flip-flop with reset 311 has an input end D connected to an output end of the output inversion selector 313, an input end CK for receiving a clock signal CLK, an input end R connected to an output end of the one-shot pulse generation circuit 326, and an output end Q connected to an input end of the delay element 322. The D flip-flop with reset 312 has an input end D connected to an output end of the output inversion selector 314, an input end CK for receiving a clock signal CLK, an input end R connected to an output end of the one-shot pulse generation circuit 327, and an output end Q connected to an input end of the delay element 324. The D flip-flop 310 has an input end D connected to the output end of the inverter 315, an input end CK for receiving a clock signal CLK, and an output end Q for outputting an inversion write enable signal.

The inverter 316 has an input end connected to the output end of the D flip-flop 309 to thereby receive a word line enable signal, and an output end connected to an input end of the delay element 321 and an input end of the NOR circuit 328. The delay element 321 has an output end connected to an input end of the NOR circuit 328. The NOR circuit 328 has an output end for outputting a sense amplifier enable signal. The delay element 322 has an output end connected to an input end of the inverter 317 and an input end of the delay element 323. The inverter 317 has an output end connected to one input end of the NAND element 306, and the delay element 323 has an output end connected to another input end of the NAND element 306.

The NAND element 306 has an output end connected to an input end of the one-shot pulse generation circuit 326 and an input end of the NOR circuit 329. The NOR circuit 329 has an output end connected to an input end of the inverter 319. The inverter 319 has an output end for outputting a transfer gate enable signal. The delay element 324 has an output end connected to an input end of the inverter 318 and an input end of the delay element 325. The inverter 318 has an output end connected to one input end of the NAND element 307, and the delay element 325 has an output end connected to another input end of the NAND element 307. The NAND element 307 has an output end connected to an input end of the inverter 320 and an input end of the one-shot pulse generation circuit 327. The inverter 320 has an output end for outputting a write timing signal, which is connected to an input end of the NOR circuit 329.

Next, description will be given of operations of the semiconductor device 1 with reference to the drawings.

Figure 5:
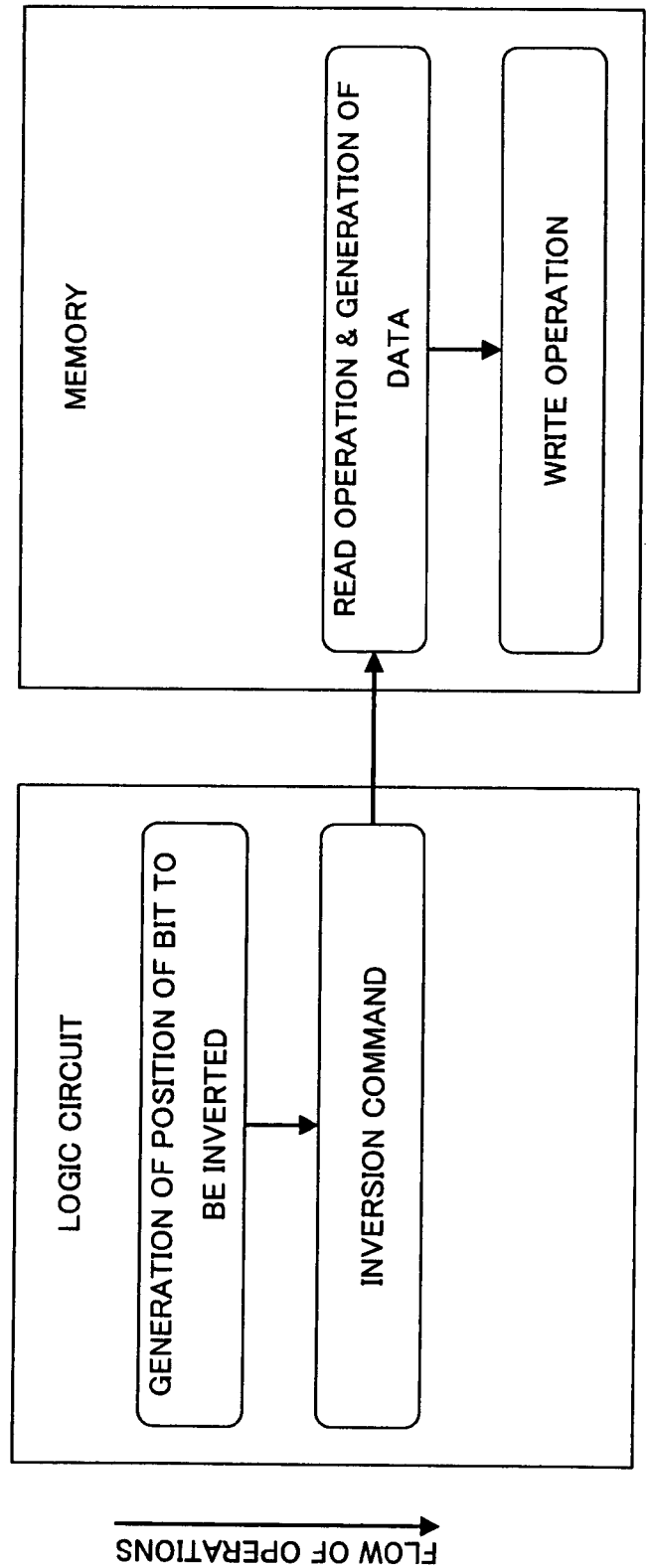
FIG. 5 shows data inversion sequences in the semiconductor memory according to the first embodiment.

FIG. 5 schematically shows data inversion sequences. As shown in FIG. 1, the semiconductor device 1 receives, as analog signals, various signals and wired/wireless communication signals, to be stored in the memory 3, through the pad 6. Such analog signal is stored in the memory 3 through the A/D converter 4 and the logic circuit 5. It is assumed herein that the analog signal is data having an error to be corrected.

In a case where data stored in the memory 3 has an error, the logic circuit 5 generates information about an address and a bit of the error. Then, the logic circuit 5 issues an inversion command to the memory 3 based on the generated information. Upon reception of the inversion command, the memory 3 reads the data therefrom, inverts the data based on inversion information, generates error corrected data, and writes the error corrected data thereto.

Figure 6:
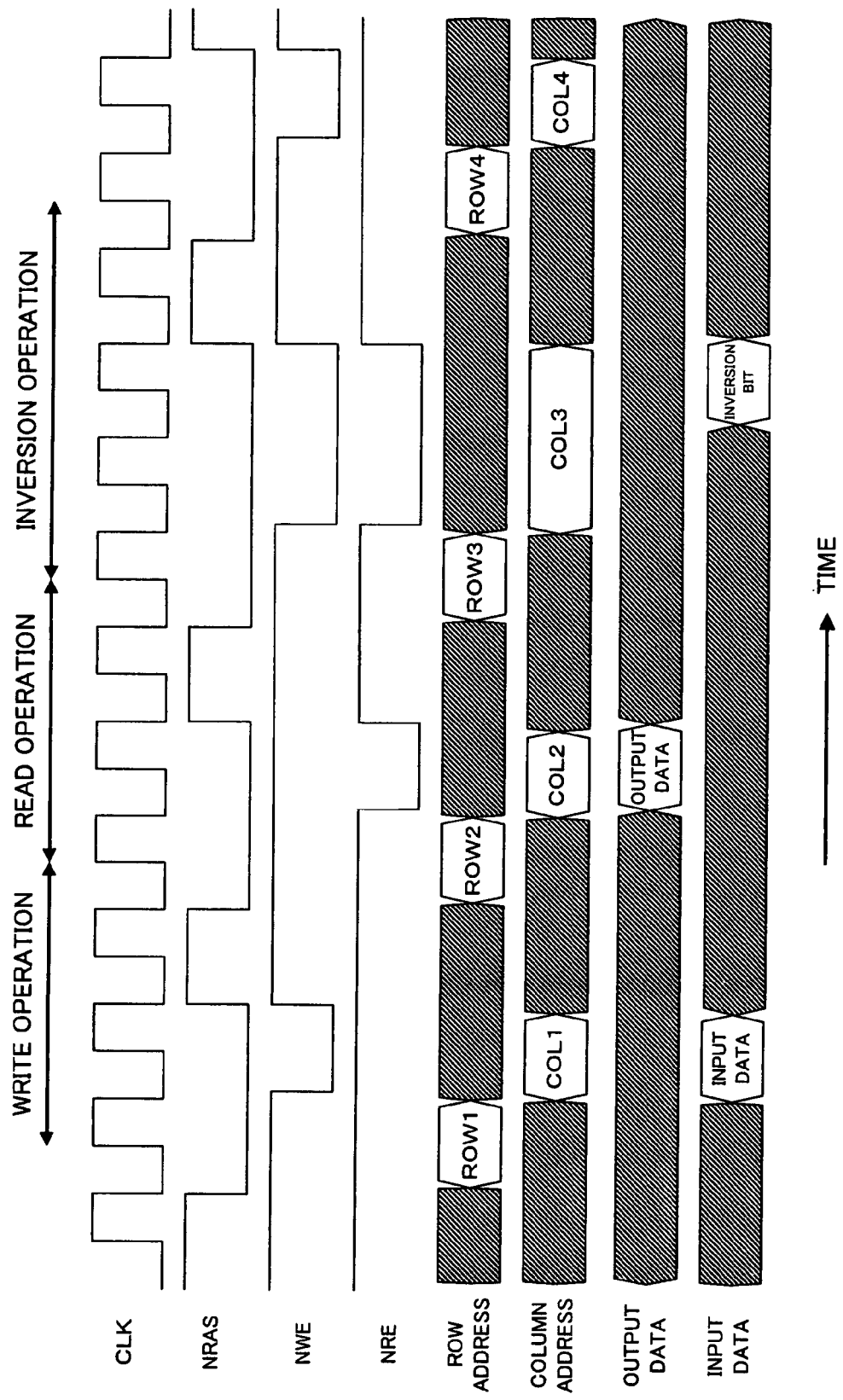
FIG. 6 is a timing chart showing waveforms of signals received by the semiconductor memory according to the first embodiment.

FIG. 6 is a timing chart showing waveforms of signals received by the memory 3.

Herein, the memory 3 according to the first embodiment is basically a DRAM of a clock synchronous type, and performs operations in synchronization with a clock signal CLK.

As shown in FIG. 6, the memory 3 performs a read operation in accordance with the following sequences. That is, the memory 3 sets a row address strobe signal NRAS at "L" level in synchronization with a leading edge of a clock signal CLK, and receives a row address. At a leading edge of a subsequent clock signal CLK, next, the memory 3 sets a read operation control signal NRE at "L" level, and receives a column address. Thus, the memory 3 generates storage data corresponding to an address received after a lapse of a predetermined access time, as output data. Next, the memory 3 sets the row address strobe signal NRAS at "H" level in synchronization with a leading edge of a subsequent clock signal CLK, and then enters a precharge state. Thereafter, the memory 3 can perform a subsequent operation.

As shown in FIG. 6, the memory 3 performs a write operation in accordance with the following sequences. The memory 3 sets a row address strobe signal NRAS at "L" level in synchronization with a leading edge of a clock signal CLK, and receives a row address. At a leading edge of a subsequent clock signal CLK, the memory 3 sets a write operation control signal NWE at "L" level, and receives a column address and input data. In a memory cell array, thus, data is stored in a predetermined site designated by the addresses. Next, the memory 3 sets the row address strobe signal NRAS at "H" level in synchronization with a leading edge of a subsequent clock signal CLK, and then enters a precharge state. Thereafter, the memory 3 can perform a subsequent operation.

As shown in FIG. 6, the memory 3 performs an inversion operation in accordance with the following sequences. The memory 3 sets a row address strobe signal NRAS at "L" level in synchronization with a leading edge of a clock signal CLK, and receives a row address. At a leading edge of a subsequent clock signal CLK, next, the memory 3 sets a read operation control signal NRE and a write operation control signal NWE at "L" level, and receives a column address. At a leading edge of a subsequent clock signal CLK, next, the memory 3 sets the read operation control signal NRE and the write operation control signal NWE at "L" level, and receives a column address and an inversion bit signal.

Thus, with regard to the data designated by the addresses, the memory 3 inverts a bit having an inversion bit signal corresponding to a bit set at "H" level. Next, the memory 3 sets the row address strobe signal NRAS at "H" level in synchronization with a leading edge of a subsequent clock signal CLK, and then enters a precharge state. Thereafter, the memory 3 can perform a subsequent operation.

Figure 7:
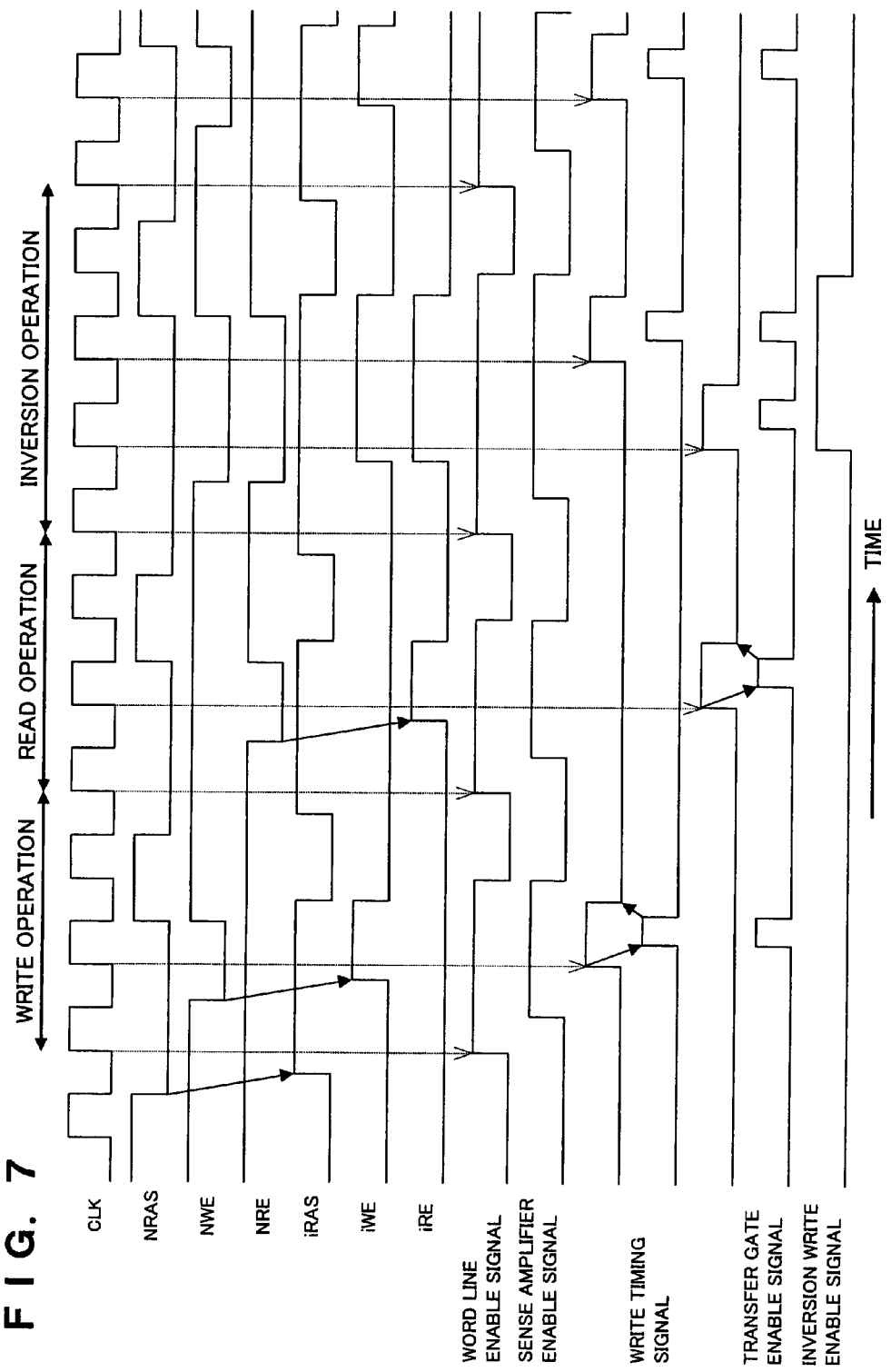
FIG. 7 is a timing chart showing control signals received by the memory core in the semiconductor memory according to the first embodiment in each operation.

FIG. 7 is a timing chart showing control signals received by the memory core 300 in the respective operations.

Each of the output inversion latch circuits 204, 205 and 206 is a so-called level latch having the following functions. That is, during a period when a clock signal CLK is set at "H" level, each of the output inversion latch circuits 204, 205 and 206 latches input data at a leading edge of the clock signal CLK. On the other hand, during a period when a clock signal CLK is set at "L" level, each of the output inversion latch circuits 204, 205 and 206 generates inverted data of input data as it is.

When a row address strobe signal NRAS is set at "L" level, an internal row address strobe signal iRAS is set at "H" level, and a word line enable signal is set at "H" level in synchronization with a rise of a clock signal CLK. Thereafter, a sense amplifier enable signal is set at "H" level after a lapse of a time determined by the delay element 321.

When a write operation control signal NWE is set at "L" level, an internal write operation control signal iWE is set at "H" level, and a write timing signal is set at "H" level after a lapse of a time determined by the delay element 324 from a leading edge of a subsequent clock signal CLK. When the write timing signal is set at "H" level, the one-shot pulse generation circuit 327 outputs a reset pulse to the D flip-flop with reset 312, so that the D flip-flop with reset 312 is reset. The write timing signal is set at "L" level after a lapse of a time determined by the delay element 325.

A timing of a transfer gate enable signal is similar to that of the write timing signal. That is, when a read operation control signal NRE is set at "L" level, an internal read operation control signal iRE is set at "H" level, and the transfer gate enable signal is set at "H" level after a lapse of a time determined by the delay element 322 from a leading edge of a subsequent clock signal CLK. When the transfer gate enable signal is set at "H" level, the one-shot pulse generation circuit 326 outputs a reset pulse to the D flip-flop with reset 311, so that the D flip-flop with reset 311 is reset. The transfer gate enable signal is set at "L" level after a lapse of a time determined by the delay element 323.

When the read operation control signal NRE and the write operation control signal NWE are set at "L" level concurrently, an inversion operation is started. That is, the internal read operation control signal iRE and the internal write operation control signal iWE are set at "H" level, and data outputted from the D flip-flop 308 is set at "L" level at a leading edge of a clock signal CLK. At a rise of the clock signal CLK, data outputted from the output inversion selector 313 is set at "H" level and data outputted from the output inversion selector 314 is set at "L" level. Therefore, an operation for the transfer gate enable signal is similar to the read operation. At a timing of a rise of a subsequent clock signal CLK, the data outputted from the output inversion selector 313 is set at "L" level and the data outputted from the output inversion selector 314 is set at "H" level. Therefore, an operation for the write timing signal is similar to the write operation.

Figure 8:
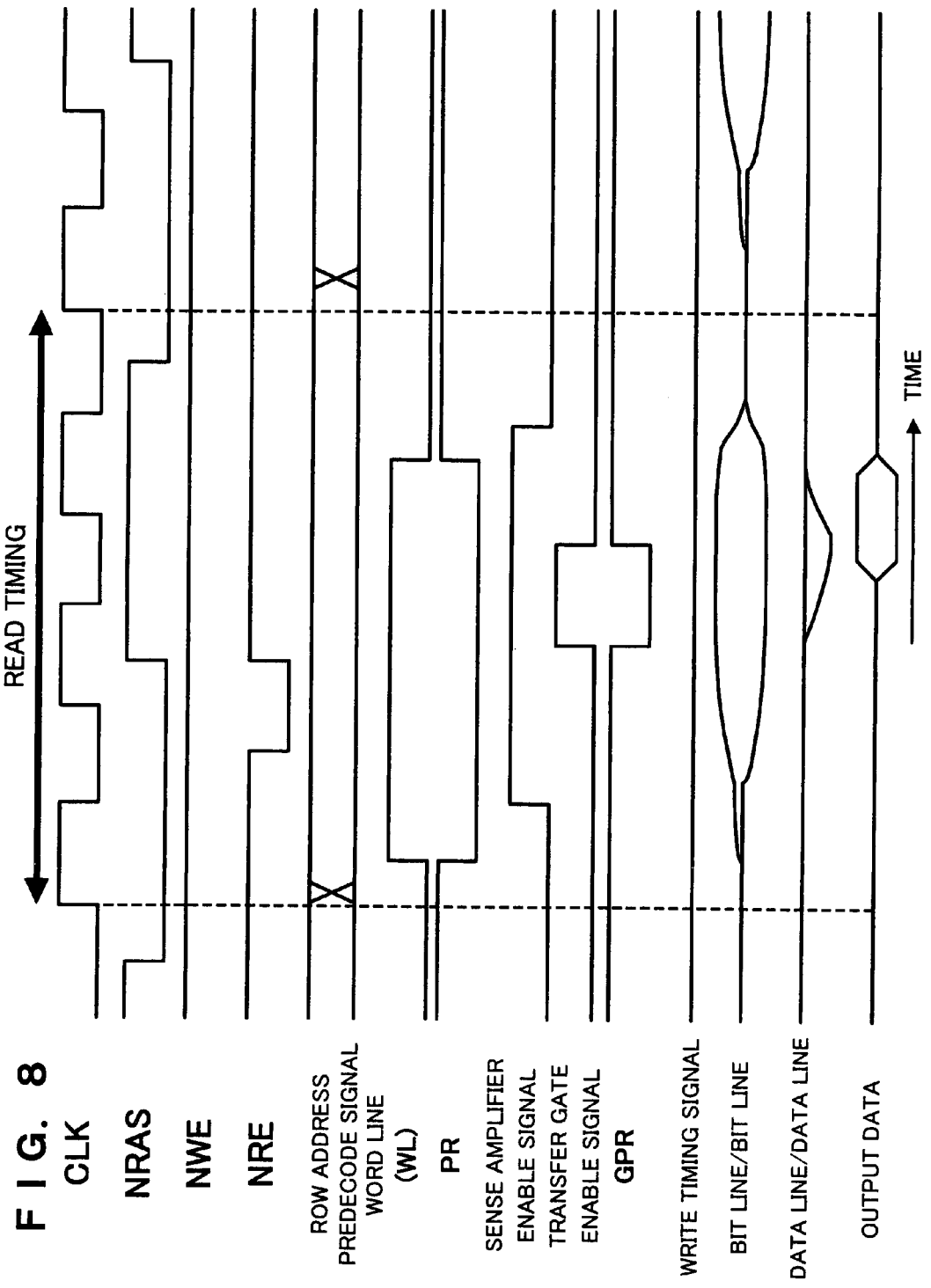
FIG. 8 is a timing chart showing a read operation of the memory core in the semiconductor memory according to the first embodiment.

FIG. 8 is a timing chart showing a read operation of the memory core 300.

When the latch circuit 207 latches a row address, the row predecoder 202 generates a row address predecode signal and outputs the row address predecode signal to the row decoder 102. When a word line enable signal is set at "H" level, a word line WL determined by the row address predecode signal is set at "H" level. Concurrently, a bit line precharge signal PR is set at "L" level, so that the bit line precharge circuit 116 is turned off. When the word line WL is set at "H" level, the memory cell 103 connected to the word line WL reads data to the pair of bit lines 106. Thereafter, when a sense amplifier enable signal is set at "H" level, an N-channel sense amplifier activation signal SEN is set at "H" level and a P-channel sense amplifier activation signal SEP is set at "L" level. Thus, the sense amplifier 104 amplifies data on the pair of bit lines 106 such that the data is set at "H" or "L" level.

When a transfer gate enable signal is set at "H" level, a transfer gate control signal TG is set at "H" level and a data line precharge signal GPR is set at "L" level, so that the pair of bit lines 106 are connected to the pair of data lines 115. Thus, data on the pair of bit lines 106 are read to the pair of data lines 115. The read amplifier 107 amplifies a difference in potential between the pair of data lines 115 and outputs the resultant to the output data latch 108; thus, the data is latched. The latched data is outputted as array output data DO to the column decoder 203. Then, in the column decoder 203, the array output data DO is sorted into "N"-bit data determined by a column address and is outputted as output data.

Thereafter, when the word line enable signal is set at "L" level, the word line WL is set at "L" level. As a result, the memory cell 103 is interrupted, and the bit line precharge circuit 116 is activated to prepare for commencement of an operation.

Figure 9:
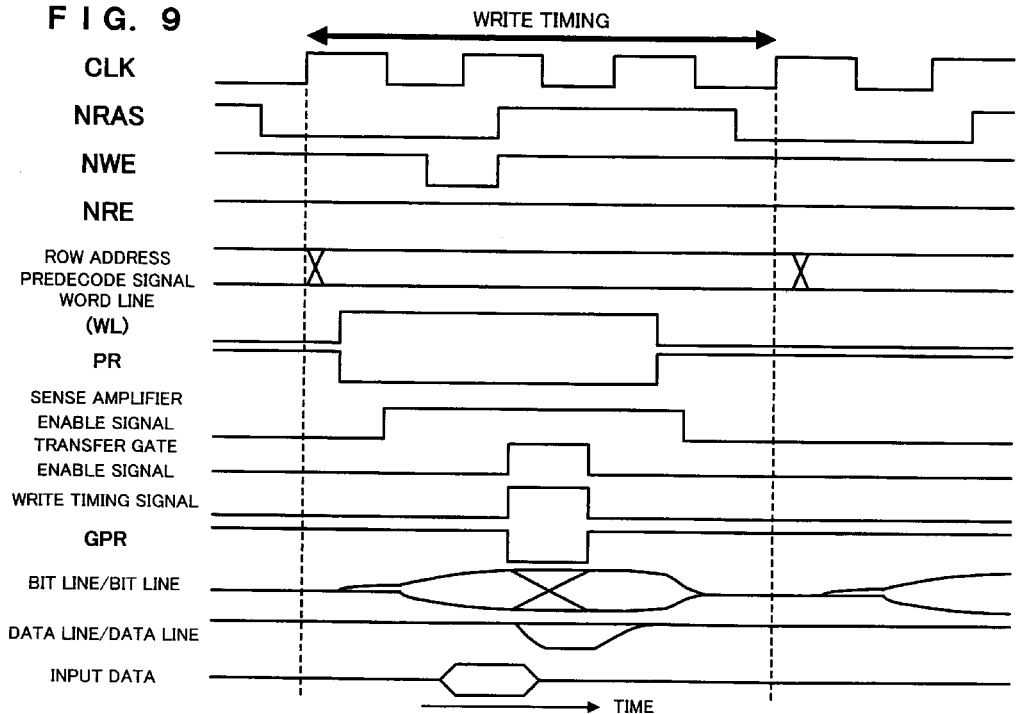
FIG. 9 is a timing chart showing a write operation of the memory core in the semiconductor memory according to the first embodiment.

FIG. 9 is a timing chart showing a write operation of the memory core 300. The write operation is equal to the read operation until amplification of data on the pair of bit lines 106 by the sense amplifier 104.

The column decoder 203 selectively sorts "X"-bit array input data DI into "N"-bit input data. In addition, the column decoder 203 sets a write buffer selection signal NWSEL at "L" level in accordance with a column address.

When a transfer gate enable signal is set at "H" level, the transfer gate control signal TG is set at "H" level and the data line precharge signal GPR is set at "L" level. Thus, the pair of bit lines 106 are connected to the pair of data lines 115. Moreover, when a write timing signal is set at "H" level, the write buffer 105 is selectively activated by the NOR element 114.

Herein, since an inversion write enable signal to be received by the activated write buffer 105 is set at "L" level, the selector 111 generates data based on the array input data DI. Thus, the data based on the array input data DI are transferred to the pair of data lines 115, so that the data are written to the pair of bit lines 106.

Thereafter, when a word line enable signal is set at "L" level, the word line WL is set at "L" level. As a result, the memory cell 103 is interrupted, and the bit line precharge circuit 116 is activated to prepare for commencement of an operation.

Figure 10:
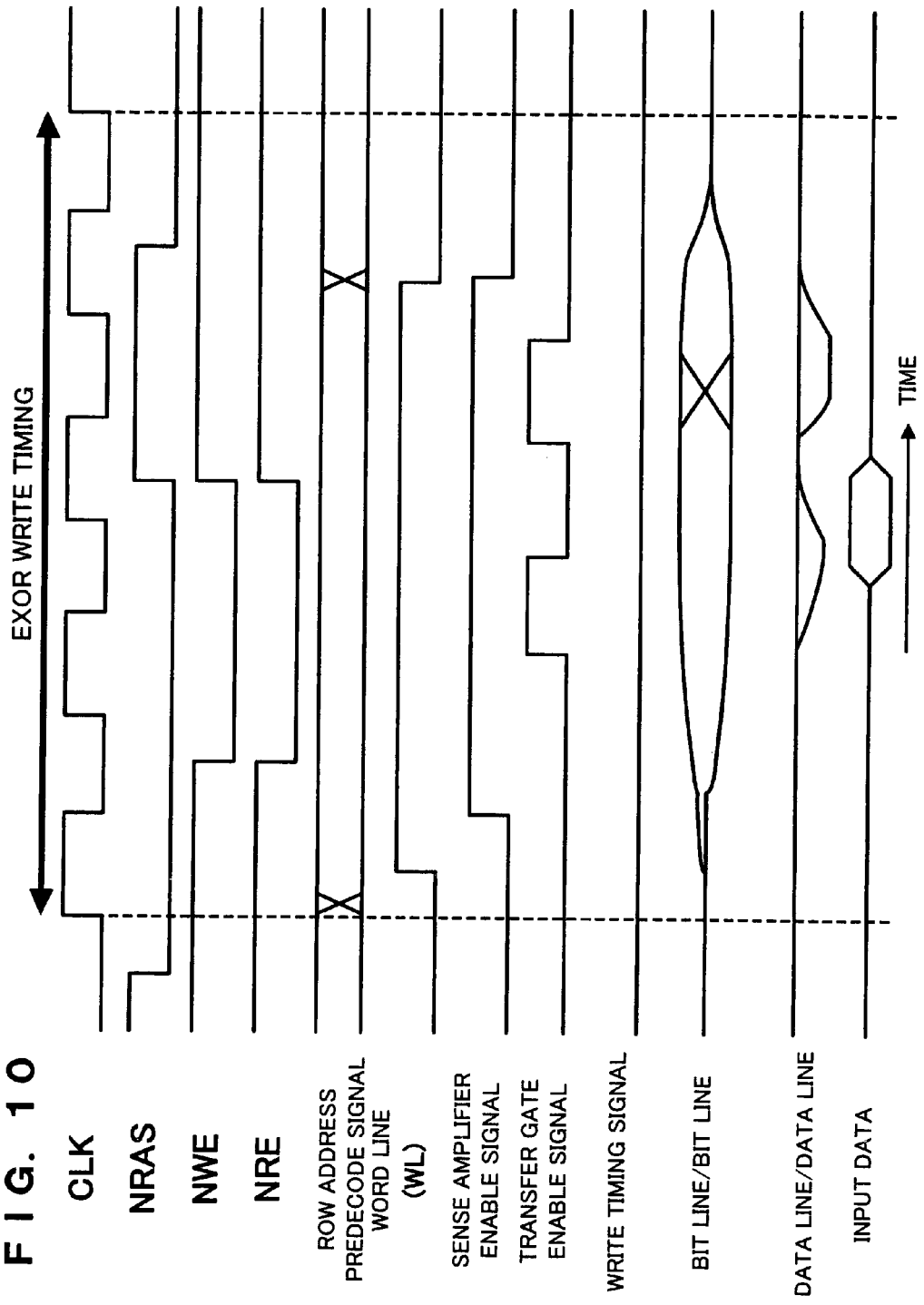
FIG. 10 is a timing chart showing an inversion operation of the memory core in the semiconductor memory according to the first embodiment.

FIG. 10 is a timing chart showing an inversion operation of the memory core 300. The inversion operation is equal to the read operation until amplification of data on the pair of bit lines 106 by the sense amplifier 104. The inversion operation is also equal to the read operation from setting of a transfer gate enable signal at "H" level to latching of data by the output data latch 108.

Since the inversion write enable signal is set at "H" level, the selector 111 selects and outputs output data of the EXOR element 110. The selector 111 outputs a result of arithmetic processing performed on data of the output data latch 108 by which the read data is latched and the array input data DI.

When the transfer gate enable signal is set at "H" level at a rise of a subsequent clock, the transfer gate control signal TG is set at "H" level and the data line precharge signal GPR is set at "L" level; thus, the pair of bit lines 106 are connected to the pair of data lines 115. When the write timing signal is set at "H" level, the write buffer 105 is selectively activated by the NOR element 114.

Since the inversion write enable signal to be received by the activated write buffer 105 is set at "L" level, the selector 111 outputs data based on the output data of the EXOR element 110. Thus, the data based on the output data of the EXOR element 110 are transferred to the pair of data lines 115, so that the data are written to the pair of bit lines 106.

Thereafter, when the word line enable signal is set at "L" level, the word line WL is set at "L" level. As a result, the memory cell 103 is interrupted, and the bit line precharge circuit 116 is activated to prepare for commencement of an operation.

With this operation, a result of arithmetic processing based on data to be inputted is prepared as write data in the memory 3 according to this embodiment; thus, data stored by consecutive clock operations can be rewritten with the result of the arithmetic processing. As a result, an operation corresponding to at least one clock can be reduced as compared with a case that write data is prepared outside the memory 3.

In addition, a new command, that is, an inversion write operation is recognized by concurrent fall of a read command and a write command, so that control terminals can be prevented from being increased in number.

Second Embodiment

Next, description will be given of a semiconductor memory according to a second embodiment of the present invention.

Figure 11:
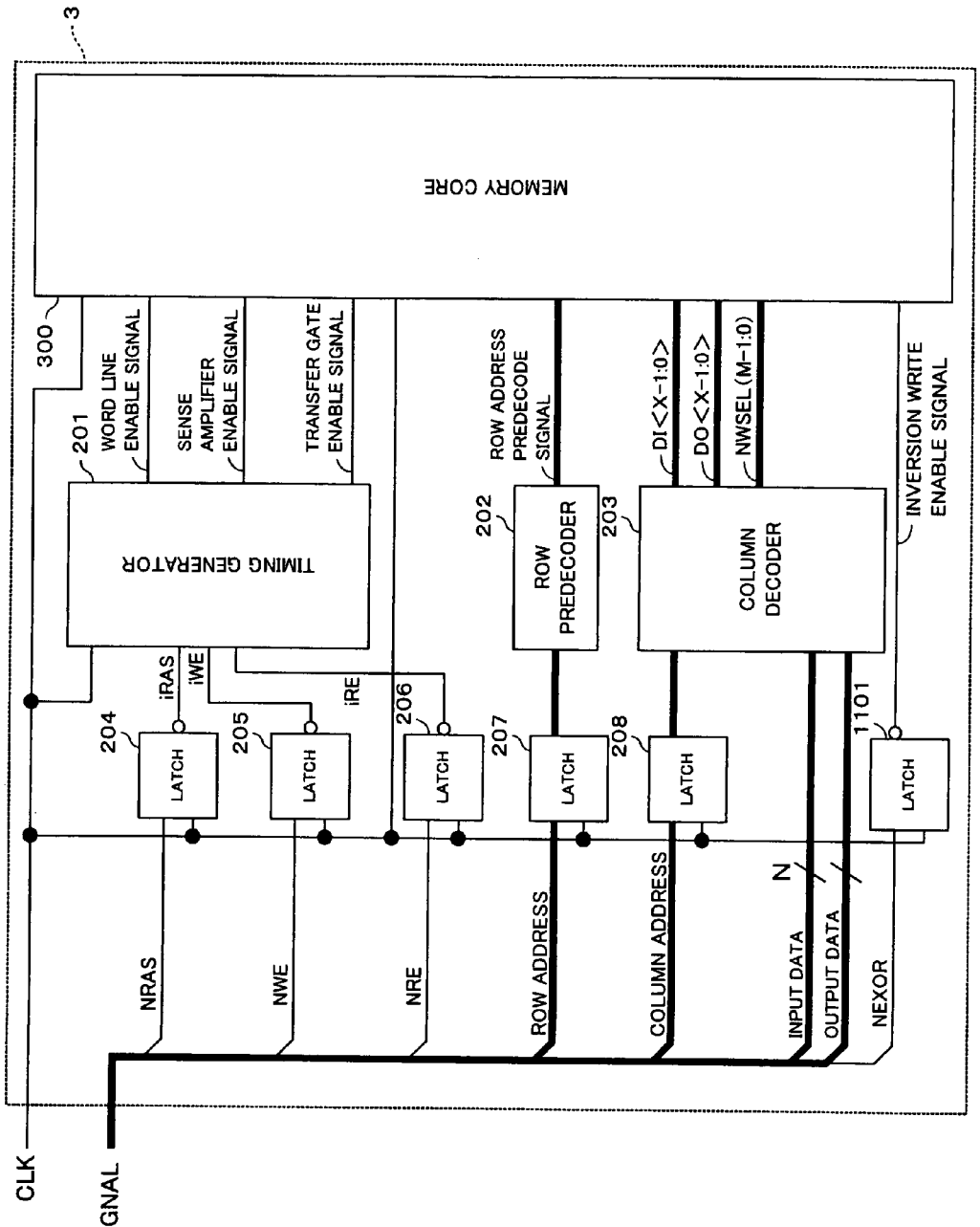
FIG. 11 is a block diagram showing a configuration of a semiconductor memory according to a second embodiment of the present invention.
Figure 12:
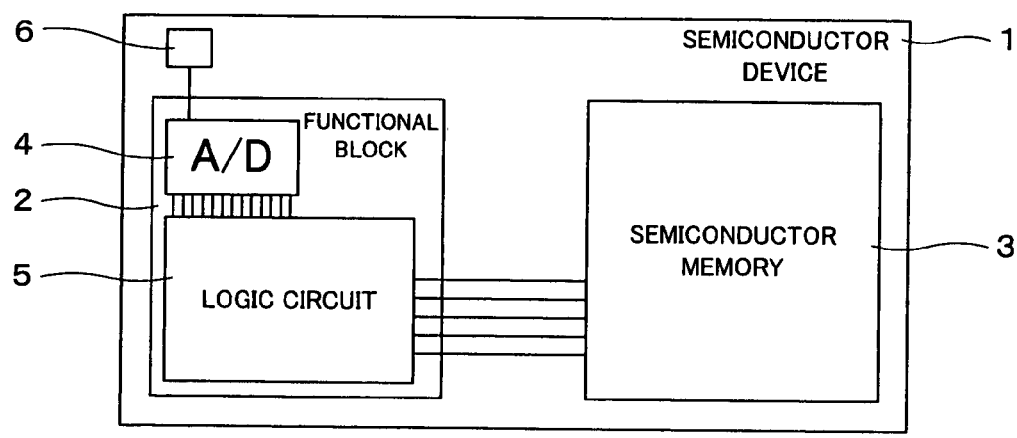
FIG. 12 is a block diagram showing a configuration of a semiconductor device on which a conventional semiconductor memory is mounted.
Figure 13:
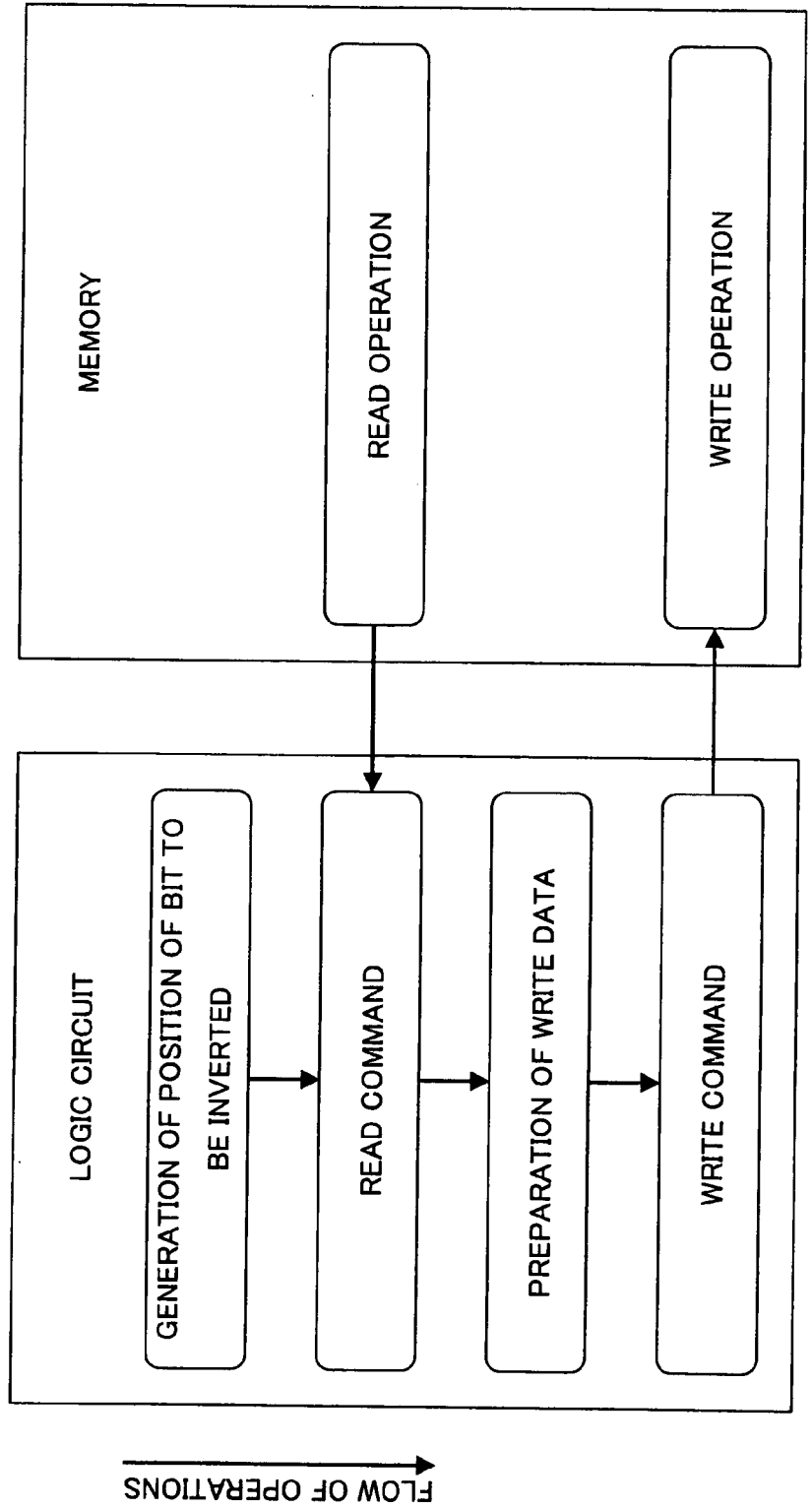
FIG. 13 shows data inversion sequences in the conventional semiconductor memory.
Figure 14:
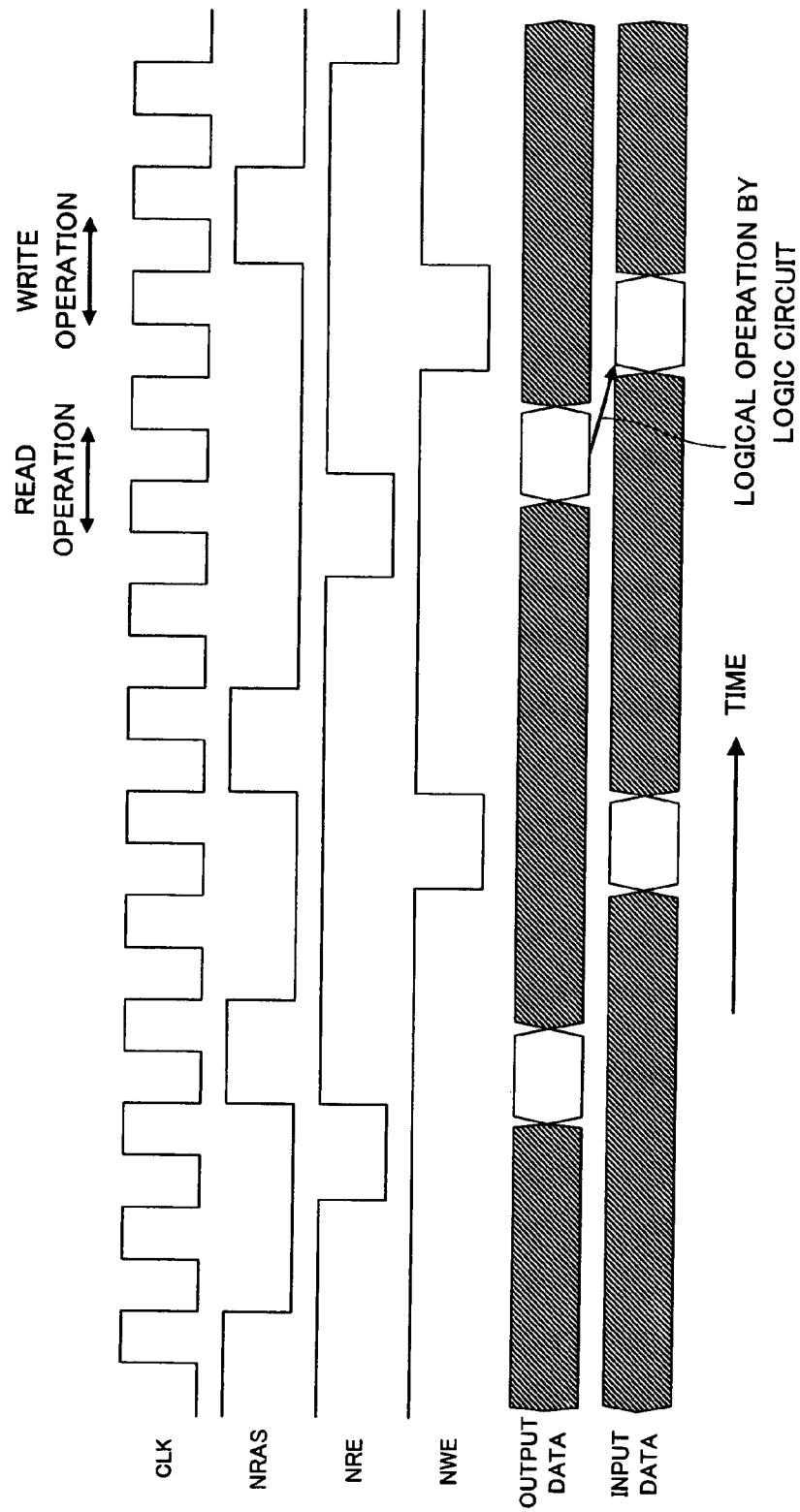
FIG. 14 is a timing chart showing waveforms of signals received by the conventional semiconductor memory.

FIG. 11 is a block diagram showing a configuration of the semiconductor memory according to the second embodiment. As shown in FIG. 11, in addition to the components of the memory 3 according to the first embodiment, the memory 3 according to the second embodiment includes an output data inversion latch circuit 1101 and receives an inversion control signal NEXOR. Specifically, the output data inversion latch circuit 1101 has an input end for receiving an inversion control signal NEXOR, and an output end for outputting an inversion write enable signal as output data.

With this configuration, one control terminal is additionally provided as compared with the configuration in the first embodiment. However, the memory 3 can directly receive an inversion write enable signal from an external unit. Thus, if it is obvious that desired data is prepared at an output data latch 108, inverted data can be written without a read cycle. Accordingly, commands for control can be reduced in number, and a transfer rate can be improved.

What is claimed is:

1. A semiconductor memory which is mounted on a semiconductor device for correcting an error in data to be inputted thereto/outputted therefrom and stores the data, the semiconductor memory comprising:
a plurality of memory cell arrays each storing the data;
a read circuit reading the data from the memory cell array;
a read data latch latching the read data from the read circuit;
an input data latch latching input data received by the semiconductor device;
a computing unit performing arithmetic processing on the input data of the input data latch and the read data of the read data latch;
a selector selecting one of data obtained by the arithmetic processing of the computing unit and the input data from the input data latch in accordance with presence/absence of an error in the data; and
a write buffer writing the data of the selector to the memory cell array, wherein
when the error in the data is to be corrected, the semiconductor memory corrects the error in the data based on the data from the computing unit.

2. The semiconductor memory according to claim 1, wherein the computing unit performs an EXOR operation.

3. The semiconductor memory according to claim 1, further comprising a read control terminal, a write control terminal, an inversion write control terminal and a data output terminal, wherein the data of the memory cell array is outputted to the data output terminal when the read control terminal is at a first potential and the write control terminal and the inversion write control terminal are at a second potential, the input data is written to the memory cell array when the read control terminal and the inversion write control terminal are at the second potential and the write control terminal is at the first potential, and the result of the arithmetic processing performed on the data of the memory cell array and the input data is written to the memory cell array when the read control terminal and the write control terminal are at the second potential and the inversion write control terminal is at the first potential.

4. The semiconductor memory according to claim 1, further comprising a read control terminal, a write control terminal and a data output terminal, wherein
the data of the memory cell array is outputted to the data output terminal when the read control terminal is at a first potential and the write control terminal is at a second potential, the input data is written to the memory cell array when the read control terminal is at the second potential and the write control terminal is at the first potential, and the result of the arithmetic processing performed on the data of the memory cell array and the input data is written to the memory cell array when the read control terminal and the write control terminal are at the second potential.

5. The semiconductor memory according to claim 4, wherein the semiconductor memory operates in synchronization with external clocks, and when the read control terminal and the write control terminal are at the second potential, the data stored in the memory cell array is read during a period of a first clock of the external clocks and the result of the arithmetic processing performed by the computing unit on the data stored in the memory cell array and the input data is written to the memory cell array during a period of a second clock subsequent to the first clock.

* * * * *